(12) United States Patent
Chou et al.

(10) Patent No.: US 6,662,443 B2
(45) Date of Patent: Dec. 16, 2003

(54) METHOD OF FABRICATING A SUBSTRATE WITH A VIA CONNECTION

(75) Inventors: William T. Chou, Cupertino, CA (US); Solomon Beilin, San Carlos, CA (US); Michael G. Lee, San Jose, CA (US); Michael G. Peters, Santa Clara, CA (US); Wen-chou Vincent Wang, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 09/935,378

(22) Filed: Aug. 22, 2001

(65) Prior Publication Data

US 2002/0000037 A1 Jan. 3, 2002

Related U.S. Application Data

(63) Continuation of application No. 09/275,543, filed on Mar. 24, 1999.

(51) Int. Cl.[7] ................................................ H01K 3/10
(52) U.S. Cl. .......................... 29/852; 29/830; 29/846; 427/97
(58) Field of Search ................ 29/830, 852, 846, 29/850; 427/97

(56) References Cited

U.S. PATENT DOCUMENTS

| | | |
|---|---|---|
| 3,311,966 A | 4/1967 | Shaheen et al. |
| 3,335,489 A | 8/1967 | Grant |
| 3,391,457 A | 7/1968 | Reiman |
| 3,464,855 A | 9/1969 | Shaheen et al. |
| 3,791,858 A | 2/1974 | McPherson et al. |
| 4,075,757 A | 2/1978 | Malm et al. |
| 4,591,411 A | 5/1986 | Reimann |
| 4,663,497 A | 5/1987 | Reimann |
| 4,824,511 A | 4/1989 | Hartmann et al. |

(List continued on next page.)

FOREIGN PATENT DOCUMENTS

| | | | |
|---|---|---|---|
| WO | WO95/13901 | 5/1995 | ........... B23K/35/34 |

OTHER PUBLICATIONS

Ernsberger, C.N., "High Density Multi–layer Interconnect Based on Adhesiveless Flex Circuits," Oct., 1994, pp. 125–135.

Gallagher, C., et al., "Vertical Interconnect in Multilayer Applications Using Ormet® Conductive Composites," 1997, pp. 35–37.

Leach, S., et al., "Colamination Technology for Electronic Packaging Applications,"1997, pp. 38–41.

Ernsberger, C., et al., "Colaminated Multilayer Flip Chip T–BGA Package Development," 1996 FLEXCON™ pp. 29–43.

Primary Examiner—Carl J. Arbes
(74) Attorney, Agent, or Firm—Sheppard Mullin Richter & Hampton LLP

(57) ABSTRACT

A method of fabricating a multilayer interconnected substrate is disclosed. In one embodiment, the method includes providing a structure having a dielectric substrate having a first substantially planar surface and an opposing second substantially planar surface. A first conductive layer is disposed on the first substantially planar surface of the dielectric substrate, and an interface is present between the first conductive layer and the dielectric substrate. A blind via site is formed in the structure, and through the dielectric substrate to the interface between the first conductive layer and the dielectric substrate. The blind via site is filled with a conductive material by an electrolytic plating process.

46 Claims, 2 Drawing Sheets

U.S. PATENT DOCUMENTS

| | | |
|---|---|---|
| 4,856,184 A | 8/1989 | Doehling |
| RE33,108 E | 11/1989 | Ishikawa et al. |
| 4,915,983 A | 4/1990 | Lake et al. |
| 4,943,346 A | 7/1990 | Mattelin |
| 4,961,259 A | 10/1990 | Schreiber et al. |
| 4,975,142 A | 12/1990 | Iannacone et al. |
| 4,996,133 A | 2/1991 | Brighton et al. |
| 5,034,091 A | 7/1991 | Trask et al. |
| 5,100,501 A | 3/1992 | Blumenthal et al. |
| 5,118,385 A | 6/1992 | Kumar et al. |
| 5,137,597 A | 8/1992 | Curry, II et al. |
| 5,189,261 A | 2/1993 | Alexander et al. |
| 5,209,817 A | 5/1993 | Ahmad et al. |
| 5,227,013 A | 7/1993 | Kumar |
| 5,244,538 A | 9/1993 | Kumar |
| 5,274,912 A | 1/1994 | Olenick et al. |
| 5,320,979 A | 6/1994 | Hashimoto et al. |
| 5,352,325 A | 10/1994 | Kato |
| 5,362,359 A | 11/1994 | Horikoshi et al. |
| 5,362,656 A | 11/1994 | McMahon |
| 5,378,313 A | 1/1995 | Pace |
| 5,407,511 A | 4/1995 | Nakatani et al. |
| 5,419,038 A | 5/1995 | Wang et al. |
| 5,454,161 A | 10/1995 | Beilin et al. |
| 5,514,247 A | 5/1996 | Shan et al. |
| 5,541,366 A | 7/1996 | Maoz et al. |
| 5,567,329 A | 10/1996 | Rose et al. |
| 5,595,858 A | 1/1997 | Akama et al. |
| 5,622,895 A | 4/1997 | Frank et al. |
| 5,746,868 A | 5/1998 | Abe et al. |
| 5,800,650 A | 9/1998 | Anderson et al. |
| 5,863,446 A | 1/1999 | Hanson et al. |
| 5,910,255 A | 6/1999 | Noddin |
| 5,925,206 A | 7/1999 | Boyko et al. |
| 6,054,761 A | 4/2000 | McCormack et al. |
| 6,163,957 A | 12/2000 | Jiang et al. |

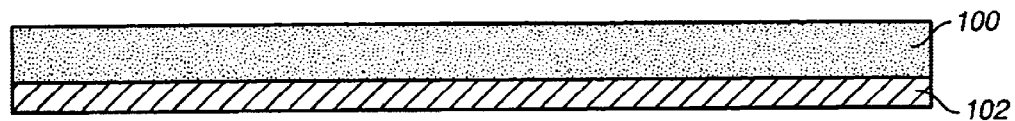
FIG._1A
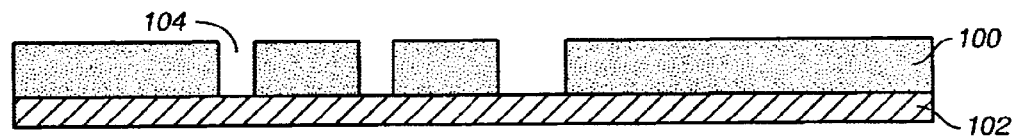
FIG._1B
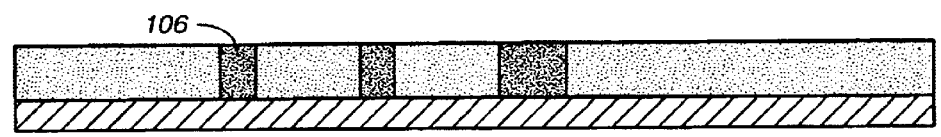
FIG._1C
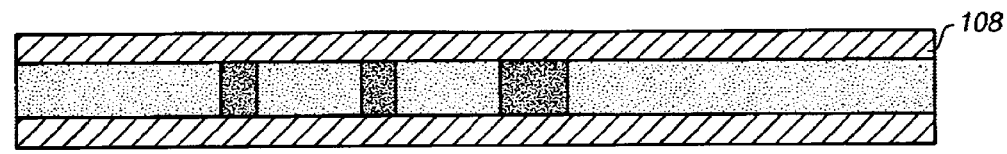
FIG._1D
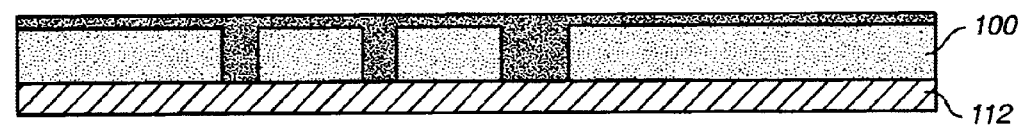
FIG._1E
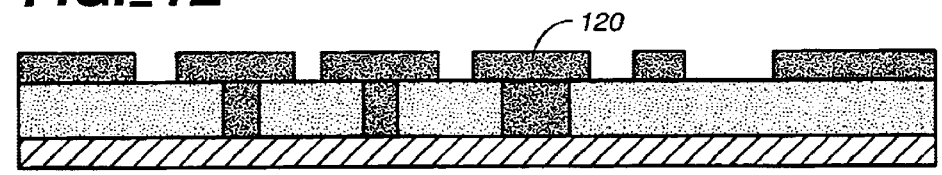
FIG._1F

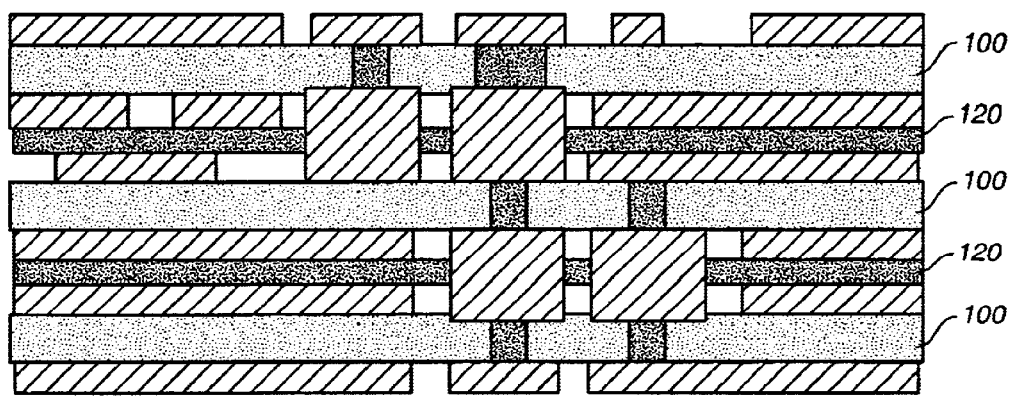
FIG._2
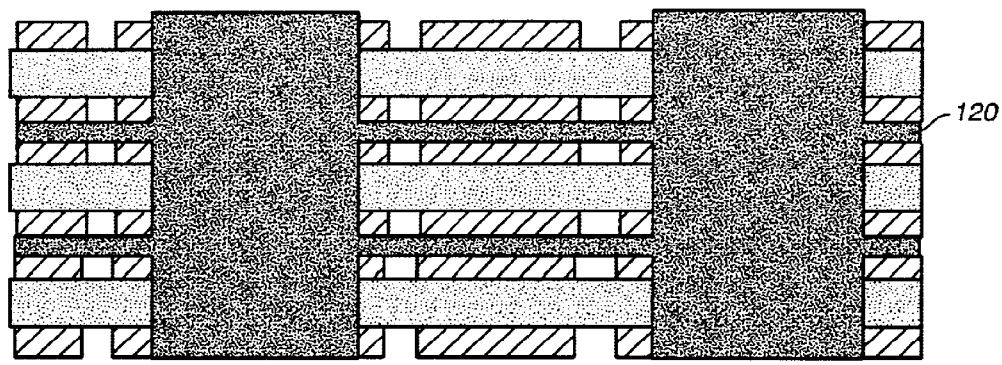
FIG._3
(PRIOR ART)

METHOD OF FABRICATING A SUBSTRATE WITH A VIA CONNECTION

This application is a continuation application of patent application Ser. No. 09/275,543, filed Mar. 24, 1999. Benefit of this earlier filing date is claimed.

BACKGROUND OF THE INVENTION

1. Field of the Invention

The present invention relates to the fabrication of multi-layer, interconnected substrates for semiconductor devices, and more specifically, to a method of fabricating a substrate having a conductive layer on each side, with the two conductive layers interconnected by a conductive via.

2. Description of the Prior Art

Double-sided and multi-layer printed circuit boards are now commonly used in the semiconductor industry to increase the density of integrated circuits. Such circuit boards are typically formed from a planar dielectric substrate having printed circuitry on each side. The conductive layers on the surfaces of the substrate are interconnected by conductive vias formed through the substrate. Multiple substrates of this kind may be stacked and interconnected to form more complex structures.

Conventionally, an interconnection between the conductive layers on the opposing surfaces of a dielectric substrate is formed by first etching a via in the dielectric substrate. A vacuum deposition or electroless plating operation is then performed to form a thin metal layer on one or both sides of the substrate. An electrical deposition process is then used to fill the via and plate the side(s) of the substrate with a metal layer of desired thickness.

However, this conventional method has several disadvantages. A vacuum deposition step is expensive to implement because of the cost of the equipment needed and the comparatively low throughput. Electroless plating operations suffer from poor adhesion of the metal layer to the substrate and small thickness of the plated metal.

Another conventional method of forming a dielectric substrate having a double sided conductive layer which is interconnected by a conductive via is to prepare the double sided substrate and then form a via hole. The via hole is then filled and connected to the two conductive layers by a metallization step. However, the via hole coating is limited in thickness by the patterned metal layer thickness because the same process step is used to fill the via hole and plate the pad(s) and trace patterns.

What is desired is a method of fabricating a substrate having a conductive layer on opposing sides, with the conductive layers interconnected by a conductive via, which overcomes the disadvantages of the conventional approaches to fabricating such a structure.

SUMMARY OF THE INVENTION

The present invention is directed to a method of fabricating a substrate having a conductive layer on opposing sides, with the conductive layers interconnected by a conductive via. The inventive method uses a dielectric substrate having a conductive layer deposited or laminated onto one or both of the substrate's opposing surfaces. For the situation of a metal layer on one side of the substrate, a laser drill may be used to drill blind vias through the dielectric, stopping at the substrate/conductive layer interface. An electrolytic plating process is used to fill the via by establishing an electrical connection to the conductive layer. A second conductive layer may be deposited or laminated to the other surface of the substrate. If the starting structure has a conductive layer on both sides of the substrate, the drill is controlled to bore through the upper conductive layer and then drilling is continued at a lower power through the substrate. The blind vias drilled through the upper conductive layer will be plated during the via filling stage, and may be planarized, if desired, to provide a planar surface between the filled via sites and the surrounding conductive layer. The conductive layer(s) may then be patterned as desired to form pads and interconnection traces.

BRIEF DESCRIPTION OF THE DRAWINGS

FIGS. 1(A) to 1(F) are side views of a substrate having a conductive layer and show the process flow for the method of the present invention.

FIG. 2 is a side view showing a multi-layered structure formed from a plurality of the substrate structures of FIG. 1, with the conductive layers of the substrates interconnected in accordance with the method of the present invention.

FIG. 3 is a side view showing a prior art method of interconnecting the conductive substrates of FIG. 2.

DETAILED DESCRIPTION OF THE INVENTION

The present invention is directed to a method for forming a dielectric substrate having an interconnection between conductive layers on either side of the substrate. A dielectric substrate has a metal layer deposited or laminated on one or both sides. A laser drill is used to pattern the top metal layer (in the case of double sided metal layers) or dielectric substrate. For a single sided metal layer, the drill bores through the dielectric substrate at a low power with the drill stopping at the underlying metal layer. For a double sided metal layer, the drill bores through the top metal layer at a comparatively high power and then bores through the dielectric substrate at a lower power, again stopping at the underlying metal layer. The laser drilling blindly patterns the substrate or top metal layer and substrate to form the sites for the vias interconnecting the two metal layers. The via sites may be cleaned after the laser drilling. An electrolytic plating operation is then used to fill the via sites with a conductive material. This can be performed by making an electrical connection to the underlying metal layer. In the case of a single sided metal layer, a second metal layer may then be deposited or laminated on top of the substrate. In the case of a double sided metal layer, the holes through the top layer will be plated during the via filling operation. The via areas can be planarized, if necessary, to make the filled via regions of the same height as the surrounding metal layer.

FIGS. 1(A) through 1(F) show the process flow for forming the substrate with a via connection of the present invention. As shown in FIG. 1 (A), the inventive process begins with a dielectric substrate 100. A metal layer 102 is formed on one or both sides of substrate 100. Note that FIG. 1(A) depicts the structure with a conductive layer on a single side. Metal layer(s) 102 may be directly deposited on substrate 100 or laminated on substrate 100 by means of adhesives or a casting process (wherein a liquid dielectric is cast onto a metal foil) may be used to form the combined dielectric-conductive layer structure.

As shown in FIG. 1(B), a computer controlled laser drill is then used to pattern the upper surface of substrate 100. The laser is used to form blind via sites 104 by boring through substrate 100 and stopping at the surface of underlying metal layer 102. An optional cleaning operation may then be used to clean the via sites and prepare the metal/dielectric structure for the next step.

An electrolytic plating process is then used to fill the via sites with a conductive material 106 (FIG. 1(C)). This can be accomplished by making an electrical connection to metal layer 102. A second metal layer 108 can then be deposited on or laminated to the top surface of substrate 100 (FIG. 1(D)) to form the desired substrate structure.

For the case of a starting structure having a metal layer 112 deposited or laminated on both sides of substrate 100, the laser drill is set at a relatively higher power to drill the blind via sites through the upper metal layer, and then the laser power is reduced to drill through the substrate. Again, the drilling operation is discontinued at the interface between the substrate and the underlying metal layer. In this variation of the inventive process, the hole through the upper metal layer at each via site will become plated with a conductive material as the vias are filled. In the event that the original conductive layer on the substrate was thinner than the height of the plated region above the substrate, the via region may require planarization to make it the same height as the surrounding metal layer (the result of which is shown in Figure (E)). Note that in this embodiment of the invention, the only region of the dielectric substrate which is exposed is that of the via region during the plating process. This minimizes the exposed region and reduces the water absorbed during the processing. This limits the expansion and dimensional change of the dielectric substrate.

If the upper metal layer is directly deposited on the patterned substrate, it may be patterned by a semi-additive process to form a high density conductive pattern 120 which is electrically connected to the vias (FIG. 1(F)).

FIG. 2 is a schematic side view of a multi-layer structure formed using the inventive method. As shown in the figure, an interconnected multi-layer structure can be formed by causing two or more conductive layer-dielectric substrate-conductive layer structures to adhere to each other using an adhesive layer 120. The overall structure of FIG. 2 may be formed by first processing each conductive layer-substrate-conductive layer structure separately in accordance with the method of the present invention and then bonding them together using adhesive 120. Where desired, electrical connection can be made across an adhesive layer between conductive layers on different substrates by means of an appropriate interconnection technology which is suited to vertically interconnecting two substrates. One such technology is the Z-connection technology developed by Fujitsu, Ltd., the assignee of the present invention, and which is described in U.S. patent application Ser. No. 09/192,000, entitled "Multilayer Laminated Substrates with High Density Interconnects and Methods of Making the Same," filed Nov. 13, 1998, and U.S. patent application Ser. No. 09/203,126, entitled "Conductive Composition," filed Dec. 1, 1998, the contents of which are hereby incorporated by reference.

FIG. 2 demonstrates an advantage of the inventive method relative to the conventional approaches to forming such a multi-substrate structure. FIG. 3 is a side view showing a prior art method of interconnecting the conductive substrates of FIG. 2. As shown in FIG. 3, when a plated through hole is used to interconnect conductive layers on multiple substrates, a hole is drilled through all of the layers of the previously assembled multiple substrate structures. A metallization process is then carried out to electrically connect the layers together. As shown in the figure, this can result in a significant portion of the available active device region area of each layer being occupied by the plated through hole. This is unnecessary for layers where no connection is required. In contrast, the inventive method permits customization of the interconnection locations and increases the available connection routing regions.

In addition to the laser drilling method mentioned for forming the blind vias to pattern the dielectric substrate, a wet etch, plasma etch, or other suitable means may be used to selectively pattern the substrate without boring into the underlying conductive layer. A plasma or wet chemical etch may be used to clean the via sites prior to the metallization process.

The dielectric substrate may be either a flexible or rigid material. In the case of using a flexible material, the inventive method is particularly advantageous because it addresses the dimensional control problems associated with the processing of such substrates. As is known, thermal and mechanical variations during the processing of flexible substrates can cause dimensional variations between regions which require precise alignment. For example, water absorption can cause expansion of a dielectric film. The inventive method acts to reduce this problem by minimizing the exposed area of the substrate during the plating step.

The thickness of the plated structure which extends above the surface of the dielectric can be controlled to produce a final surface which is substantially planar with either the top surface of the dielectric substrate (for the case of a starting structure having a single conductive layer) or the top surface of the upper conductive layer. The present invention effectively decouples the via filling and conductive pad and trace metallization steps into separate steps to eliminate any restrictions on the dimensions of the filled via structure found in conventional methods which use the same process step to fill up the via and plate pad and trace patterns.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of fabricating a multilayer interconnected substrate, the method comprising:

providing a structure comprising a dielectric substrate having a first substantially planar surface and an opposing second substantially planar surface, a first conductive layer disposed on the first substantially planar surface of the dielectric substrate, and an interface between the first conductive layer and the dielectric substrate:

forming a blind via site in the structure, wherein the blind via site extends through the dielectric substrate to the interface between the first conductive layer and the dielectric substrate;

filling the blind via site with a conductive material by an electrolytic plating process which includes making an electrical connection to the first conductive layer; and laminating a second conductive layer substantially across the majority of the second substantially planar surface of the dielectric substrate, wherein the laminated second conductive layer is connected to the filled blind via site.

2. The method of claim 1 additionally comprising patterning the second conductive layer at least one exposed portion of the dielectric substrate not having a via.

3. The method of claim 2 wherein none of the exposed portion of the dielectric substrate include a via.

4. The method of claim 1 wherein said first conductive layer is disposed directly on the first substantially planar surface.

5. The method of claim 1 wherein said interface is aligned with the first substantially planar surface of the dielectric substrate.

6. A method of fabricating a multilayer interconnected substrate, the method comprising:

provideing a first structure comprising a first dielectric substrate having a first substantially planar surface and an opposing second substantially planar surface, a first conductive layer disposed on the first substantially planar surface of the first dielectric substrate, and a first interface between the first conductive layer and the first dielectric substrate;

forming a plurality of blind via sites in the first structure, wherein the blind via sites extend through the dielectric substrate to the first interface between the first conductive layer and the first dielectric substrate;

filling the blind via sites with a first conductive material by an electrolytic plating process which includes making an electrical connection to the first conductive layer; and laminating a second conductive layer to the second substantially planar surface of the first dielectric substrate and over the filled blind via sites, wherein the laminated second conductive layer is electrically connected to the filled bind via sites.

7. The method of claim 6 wherein forming the blind via site comprises:

laser drilling.

8. The method of claim 6 wherein said first conductive layer is disposed directly on the first substantially planar surface.

9. The method of claim 6 wherein said first interface is aligned with the first substantially planar surface of the first dielectric substrate.

10. The method of claim 6 wherein, prior to providing the structure, the structure is formed by laminating the first conductive layer to the dielectric substrate.

11. The method of claim 6 wherein, prior to providing the structure, the structure is formed by casting a liquid dielectric on a metal foil.

12. The method of claim 6 wherein the first conductive layer is in contact with the dielectric substrate.

13. The method of claim 6 wherein forming the blind via site comprises etching.

14. The method of claim 6 additionally comprising planarizing the second conductive layer until the filled blind via sites have a thickness generally equal to a thickness of the second conductive layer.

15. The method of claim 6 further comprising, after laminating the second conductive layer to the second substantially planar surface of the dielectric layer:

patterning the first and second conductive layers.

16. The method of claim 6 wherein, prior to providing the structure, the structure is formed by laminating the first conductive layer to the dielectric substrate using an adhesive.

17. The method of claim 6 further comprising, after forming the blind via site:

cleaning the blind via site using plasma etching.

18. The method of claim 6 wherein the dielectric substrate is rigid.

19. The method of claim 6 wherein the dielectric substrate is flexible.

20. The method of claim 6 additionally comprising patterning the second conductive layer to expose at least one exposed portion of the first dielectric substrate not having a via.

21. The method of claim 19 additionally comprising patterning the second conductive layer to expose a plurality of exposed portions of the first dielectric substrate wherein each of the exposed portions do not include a via.

22. The method of claim 21 wherein none of the plurality of exposed portions of the first dielectric substrate include any respective via.

23. The method of claim 22 forming the blind via sites comprises computer-controlled laser drilling.

24. The method of claim 19 additionally comprising patterning the second conductive layer to expose at least one exposed portion of the first dielectric substrate not having a via.

25. The method of claim 24 additionally comprising disposing an adhesive member on said patterned second conductive layer.

26. The method of claim 6 additionally comprising patterning the second conductive layer to expose a plurality of exposed portions of the first dielectric substrate wherein each of the exposed portions do not include a via.

27. The method of claim 26 wherein said laminating comprises disposing said second conductive layer on the second substantially planar surface of the first dielectric substrate such as to extend across a majority of the surface of first dielectric substrate.

28. The method of claim 26 wherein none of the plurality of exposed portions of the first dielectric substrate include any respective via.

29. The method of claim 6 wherein forming the blind via sites comprises computer-controlled laser drilling.

30. The method of claim 6 wherein said laminating comprises disposing said second conductive layer on the second substantially planar surface of the first dielectric substrate such as to extend across a majority of the surface of the first dielectric substrate.

31. The method of claim 30 wherein said second conductive layer extends essentially across the entire surface of the first dielectric substrate.

32. The method of claim 24 additionally comprising providing a second structure comprising a second dielectric substrate having a third substantially planar surface and an opposing fourth substantially planar surface, a third conductive layer disposed on the third substantially planar surface of the second dielectric substrate, and a second interface between the third conductive layer and the second dielectric substrate;

forming a plurality of blind via sites in the second structure, wherein the second blind via sites extend through the second dielectric substrate to a second interface between the third conductive layer and the second dielectric substrate;

filling the second blind via sites with a second conductive material by an electrolytic plating process which includes making an electrical connection to the third conductive layer;

laminating a fourth conductive layer to the fourth substantially planar surface of the second dielectric substrate and over the filled second blind via sites, wherein the laminated fourth conductive layer is electrically connected to the filled second blind via sites to produce a second multilayered interconnected substrate; and securing the second multilayered interconnected substrate to the adhesive member.

33. The method of claim 32 additionally comprising patterning the fourth conductive layer prior to said securing the second multilayered interconnected substrate to the adhesive member.

34. The method of claim 33 wherein said securing includes securing the patterned fourth conductive layer to the adhesive member.

35. The method of claim 34 wherein said laminating comprises disposing said second conductive layer on the second substantially planar surface of the first dielectric substrate such as to extend across a majority of the surface of the first dielectric substrate.

36. The method of claim 32 wherein said laminating of a second conductive layer comprises disposing said second conductive layer on the second substantially planar surface of the first dielectric substrate such as to extend across a majority of the surface of the first dielectric substrate.

37. A method of fabricating a multilayer interconnected substrate, the method comprising:

providing a structure comprising a dielectric substrate having a first substantially planar surface and an opposing second substantially planar surface, a first conductive layer on the first substantially planar surface, a second conductive layer on the second substantially planar surface, and an interface between the dielectric substrate and the second conductive layer;

laser drilling through the first conductive layer and the dielectric substrate to the interface between the dielectric substrate and the second conductive layer to form a blind via site; and filling the blind via site with a conductive material by an electrolytic plating process which includes making an electrical connection to the second conductive layer.

38. The method of claim 37 wherein said first conductive layer is disposed directly on the first substantially planar surface.

39. The method of claim 37 wherein said interface is aligned with the first substantially planar surface of the dielectric substrate.

40. The method of claim 32 further comprising:

planarizing a top portion of the filled blind via site, wherein the planarized top portion is substantially coplanar with an outer surface of the first conductive layer.

41. The method of claim 37 wherein, prior to providing the structure, the structure is formed by laminating the first and second conductive layers to the dielectric substrate.

42. The method of claim 37 wherein the dielectric substrate is flexible.

43. The method of claim 37 wherein laser drilling comprises:

laser drilling the first conductive layer at a first power level; and laser drilling the dielectric substrate at a second power level, wherein the first power level is higher than the second power level.

44. The method of claim 37 further comprising, after filling the blind via site with the conductive material:

patterning the first and second conductive layers.

45. The method of claim 37 further comprising, after forming the blind via site:

cleaning the blind via site using plasma etching.

46. The method of claim 37 wherein the dielectric substrate is rigid.

* * * * *